United States Patent
Chou

(10) Patent No.: US 7,733,395 B2
(45) Date of Patent: Jun. 8, 2010

(54) VARIABLE-GAIN AMPLIFIER CIRCUIT AND METHOD OF CHANGING GAIN AMPLIFIER PATH

(75) Inventor: Kuo-Yu Chou, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 969 days.

(21) Appl. No.: 11/428,573

(22) Filed: Jul. 5, 2006

(65) Prior Publication Data

US 2007/0257999 A1 Nov. 8, 2007

(30) Foreign Application Priority Data

May 8, 2006 (TW) ................. 95116184 A

(51) Int. Cl.
*H04N 5/20* (2006.01)
(52) U.S. Cl. ...................................... 348/255
(58) Field of Classification Search .............. 348/300, 348/255, 254; 330/254
See application file for complete search history.

(56) References Cited

U.S. PATENT DOCUMENTS

| | | | |
|---|---|---|---|
| 5,661,434 A * | 8/1997 | Brozovich et al. | 330/51 |
| 6,118,989 A | 9/2000 | Abe et al. | |
| 6,265,935 B1 * | 7/2001 | Kaneda et al. | 330/51 |
| 6,329,875 B1 * | 12/2001 | Ishida et al. | 330/51 |
| 6,515,602 B2 * | 2/2003 | Ahn et al. | 341/139 |
| 6,919,761 B2 | 7/2005 | Cho et al. | |
| 7,064,604 B2 * | 6/2006 | Herold | 330/51 |
| 7,525,572 B2 * | 4/2009 | Katoh et al. | 348/208.2 |
| 2001/0034217 A1 * | 10/2001 | Loke et al. | 455/126 |
| 2002/0027453 A1 * | 3/2002 | Kulhalli et al. | 327/96 |

FOREIGN PATENT DOCUMENTS

JP 2006121135 A * 5/2006

OTHER PUBLICATIONS

"Office Action of Taiwan counterpart application", issued on Apr. 3, 2009, p. 1-9.

* cited by examiner

*Primary Examiner*—Jason Chan
*Assistant Examiner*—Gary C Vieaux
(74) *Attorney, Agent, or Firm*—Jianq Chyun IP Office

(57) ABSTRACT

A variable-gain amplifier circuit and a method of changing gain amplifier paths are provided for receiving and amplifying an image sensing signal. The variable-gain amplifier circuit includes variable path and gain amplifier circuits. According to the amplification factor for the image sensing signal, the gain amplifier paths in the variable path and gain amplifier circuits are changed based on a control signal, so as to achieve the appropriate construction of the variable-gain amplifier circuit. The image sensing signal generates the required image result through appropriate numbers of variable gain amplifiers, thereby decreasing the power consumption of the circuit and reducing the design requirement of the circuit.

14 Claims, 4 Drawing Sheets

VARIABLE-GAIN AMPLIFIER CIRCUIT AND METHOD OF CHANGING GAIN AMPLIFIER PATH

CROSS-REFERENCE TO RELATED APPLICATION

This application claims the priority benefit of Taiwan application serial no. 95116184, filed on May 8, 2006. All disclosure of the Taiwan application is incorporated herein by reference.

BACKGROUND OF THE INVENTION

1. Field of Invention

The present invention relates to a signal amplifier circuit, in which controllable amplifier gain. More particularly, the present invention relates to a variable-gain amplifier circuit and a method of changing the gain amplifier path suitable for receiving and amplifying an image sensing signal, wherein the path of amplifying the image sensing signal is also controllable.

2. Description of Related Art

Complementary metal oxide semiconductor (CMOS) image sensor is an image sensor widely used at present and can be produced by using a standard semiconductor process. Since CMOS devices have the advantages of low power consumption, low cost and can be well integrated with peripheral circuits, the CMOS image sensors have been widely used in many fields such as digital cameras, camera mobile phones, video recorders, security monitor systems, and medical equipments.

Generally, a CMOS image sensor has a variable-gain amplifier circuit with an amplification factor of 8~24, wherein the factor is subdivided. Based on the consideration of the circuit layout and the linearity of variable gain amplifiers (VGA), the variable-gain amplifier circuit in the CMOS image sensor usually comprises a plurality of VGAs connected in series. As an operational amplifier in the VGA are not optimal, for example, having a limited DC gain and limited bandwidth, the input sensing signal is distorted after passing through each stage of the amplifying circuit. Therefore, in order to reduce distortion, the DC gain and bandwidth of the operational amplifier must be increased. However, the above two characteristics, impacting each other, cannot be improved simultaneously. In addition, after passing through the variable-gain amplifier circuit, the signal must be converted to be digital data by a high-speed analog-to-digital converter (ADC), so the quality of the signal amplified by the VGAs must exceed the resolution of the subsequent ADC. Therefore, the operational amplifier in the preceding VGA must meet a high requirement. To achieve the requirements of a high DC gain and broadband, the operational amplifier usually consumes a large amount of power and occupies a large area of the chip. In another aspect, since the input sensing signal must pass through every stage of VGA to reach the ADC, the gain error of the whole circuit is increased with the increase of the number of amplifiers and the latency of the whole circuit is increased accordingly.

FIG. 1 is a block view of a variable-gain amplifier circuit 100 for receiving and amplifying the image sensing signal in the conventional CMOS image sensor. As shown in FIG. 1, the variable-gain amplifier circuit 100 comprises a VGA 110 and a VGA 120 connected in series. As such, the input sensing signal must pass through the VGA 110 and the VGA 120 to reach an ADC 130. If a feedback factor $\beta_1$ of the VGA 110 and a feedback factor $\beta_2$ of the VGA 120 are both 1, the gain of the VGA 110 and the gain of the VGA 120 are both 1, i.e., the output power levels are 0 db. If the DC gain of the operational amplifier in the VGA 110 is A1 and the DC gain of the operational amplifier in the VGA 120 is A2, the gain error generated by the VGA 110 is calculated to be 1/(1+A1) and the gain error generated by the VGA 120 is 1/(1+A2). Thus, after the input sensing signal passes through the VGA 110 and the VGA 120, the signal distortion caused by the gain errors of the above two amplifiers is approximately 1/(1+A1)+1/(1+A2). If the resolution of the ADC 130 is 10 bits, the distortion of the signal input into the ADC 130 must be smaller than one half of the least significant bit (LSB) of the ADC 130 (i.e., $\frac{1}{2}^{11}$). As such, the values of A1 and A2 must be larger than 4096. Besides, if neither of the output power levels of the VGA 110 and the VGA 120 is 0 db, the values of A1 and A2 must be larger.

In the conventional variable-gain amplifier circuit, the way to reduce the signal distortion is to increase the DC gain of the operational amplifier in the VGA while maintaining the bandwidth of the operational amplifier. However, this design method may cause a great increase in the chip area and power consumption of the circuit.

SUMMARY OF THE INVENTION

Therefore, the present invention provides a variable-gain amplifier circuit, for receiving and amplifying an image sensing signal. The variable-gain amplifier circuit comprises two variable path and gain amplifier circuits. When the image sensing signal does not need a large amplification factor, only the gain amplifier paths in the variable path and gain amplifier circuits are changed to make the image sensing signal pass through a less number of VGA for generating a required image result, thereby reducing the power consumption of the circuit and saving the manufacturing cost.

The present invention provides a variable-gain amplifier circuit, for receiving and amplifying an image sensing signal. The variable-gain amplifier circuit comprises a plurality of variable path and gain amplifier circuits. When the image sensing signal does not need a large amplification factor, only the gain amplifier paths in the variable path and gain amplifier circuits are changed to make the image sensing signal pass through a less number of VGA for generating a required image result, thereby reducing the power consumption of the circuit and saving the manufacturing cost to some extent.

The present invention provides a variable-gain amplifier circuit, for receiving and amplifying an image sensing signal. The variable-gain amplifier circuit comprises two VGAs and a path changing circuit. When the image sensing signal does not need a large amplification factor, only the gain amplifier paths are changed by the path changing circuit to make the image sensing signal pass through a less number of VGA for generating a required image result, thereby reducing the power consumption of the circuit and saving the manufacturing cost.

The present invention provides a method of changing the gain amplifier paths for receiving and amplifying an image sensing signal, wherein two VGAs are provided. The gain amplifier paths through which the image sensing signal passes are respectively controlled according to two control signals, thereby reducing the power consumption of the circuit as required.

The present invention provides a method of changing the gain amplifier paths for receiving and amplifying an image sensing signal, wherein two VGAs are provided. The gain amplifier paths through which the image sensing signal passes are controlled according to a control signal, so as to reduce the power consumption of the circuit as required.

In an aspect of the present invention, a variable-gain amplifier circuit is provided for receiving and amplifying an image sensing signal. The variable-gain amplifier circuit comprises a first variable path and gain amplifier circuit and a second variable path and gain amplifier circuit. The first variable path and gain amplifier circuit comprises a first VGA. The first variable path and gain amplifier circuit makes the signal at the output end to be the signal at the input end either being amplified by the first VGA or bypassing without being amplified by the first VGA according to a first control signal. The second variable path and gain amplifier circuit comprises a second VGA. The second variable path and gain amplifier circuit makes the signal at the output end to be the signal at the input end being amplified by the second VGA or bypassing without being amplified by the second VGA according to a second control signal.

According to an embodiment of the present invention, the first variable path and gain amplifier circuit further comprises a first switch circuit connected in series with the first VGA and a second switch circuit coupled between the input end and the output end of the first variable path and gain amplifier circuit. The first control signal turns on either the first switch circuit or the second switch circuit at a time. The second variable path and gain amplifier circuit further comprises a third switch circuit connected in series with the second VGA and a fourth switch circuit coupled between the input end and the output end of the second variable path and gain amplifier circuit. The second control signal turns on either the third switch circuit or the fourth switch circuit at a time.

According to an embodiment of the present invention, the output end of the variable-gain amplifier circuit of the present invention is coupled to an ADC. When the signal at the output end of the variable-gain amplifier circuit is an image sensing signal being amplified by the first VGA and the second VGA, the ADC reduces the resolution of the output digital signal. Further, the above variable-gain amplifier circuit further comprises a controller for outputting the first control signal and the second control signal according to the digital signal output by the ADC, so as to control the paths in the first and second variable path and gain amplifier circuits.

In another aspect of the present invention, a variable-gain amplifier circuit is provided for receiving and amplifying an image sensing signal. The variable-gain amplifier circuit comprises a plurality of variable path and gain amplifier circuits connected in series. Each of the variable path and gain amplifier circuits comprises a VGA. Additionally, each of the variable path and gain amplifier circuits makes the signal at the output end to be the signal at the input end being amplified by the above VGA or bypassing without being amplified by the VGA according to a control signal.

According to an embodiment of the present invention, each of the variable path and gain amplifier circuits further comprises a first switch circuit connected in series with the above VGA and a second switch circuit coupled between the input end and the output end of each variable path and gain amplifier circuits. The above control signal turns on either the first switch circuit or the second switch circuit at a time.

According to an embodiment of the present invention, the output end of the variable-gain amplifier circuit is coupled to an ADC. When the signal at the output end of the variable-gain amplifier circuit is an image sensing signal amplified by a plurality of VGAs, the ADC reduces the resolution of the output digital signal. Further, the variable-gain amplifier circuit further comprises a controller for outputting the control signals according to the digital signal output by the ADC, so as to control the paths in the variable path and gain amplifier circuits.

In still another aspect of the present invention, a variable-gain amplifier circuit is provided for receiving and amplifying an image sensing signal. The variable-gain amplifier circuit comprises a first VGA, a second VGA, and a path changing circuit coupled to the first VGA and the second VGA. The path changing circuit makes the signal at the output end of the variable-gain amplifier circuit to be an image sensing signal being amplified by either the first VGA or the second VGA, or bypassing without being amplified by both the first and second VGAs, or being amplified by both the two amplifiers according to a control signal.

According to an embodiment of the present invention, the output end of the variable-gain amplifier circuit is coupled to an ADC. When the signal at the output end of the variable-gain amplifier circuit is the image sensing signal being amplified by the first and the second VGAs, the ADC reduces the resolution of the output digital signal. In addition, the variable-gain amplifier circuit further comprises a controller for outputting the control signals according to the digital signal output by the ADC, so as to control the path changing circuit.

In another aspect of the present invention, a method of changing the gain amplifier paths is provided for receiving and amplifying an image sensing signal. The method comprises providing a first VGA and a second VGA; making an intermediate signal to be the image sensing signal being amplified by the first VGA or bypassing without being amplified by the first VGA according to a first control signal; and making the output signal to be the above intermediate signal being amplified by the second VGA or bypassing without being amplified by the second VGA according to a second control signal.

In another aspect of the present invention, a method of changing the gain amplifier paths is provided for receiving and amplifying an image sensing signal. The method comprises providing a first VGA and a second VGA, and making the output signal to be the image sensing signal at the input end being amplified by passing through either the first VGA or the second VGA, or bypassing without being amplified by both the first and second VGAs, or being amplified by both the two amplifiers according to a control signal.

The present invention adopts a method of dynamically changing the gain amplifier paths in the variable-gain amplifier circuit. If the input sensing signal does not need a large amplification factor, the signal passes through only a less number of VGA to achieve a better circuit performance with small gain errors. Further, when the sensing signal needs a large amplification factor, the signal passes through more numbers of VGAs and the resolution order of the ADC is adjusted, such that the processing time of the whole circuit is the same as that of the circuit with the signal passing through a lower resolution of ADC. Moreover, the gain amplifier paths can be dynamically changed for reducing the design requirement of the circuit, thus avoiding consuming a large amount of power and reducing the chip area.

In order to make the aforementioned and other objects, features and advantages of the present invention comprehensible, preferred embodiments accompanied with figures are described in detail below.

DESCRIPTION OF EMBODIMENTS

The exemplary embodiments of the present invention are illustrated in detail below with reference to the accompanying drawings, such that the aspects and features of the present invention are apparent.

Figure 1:
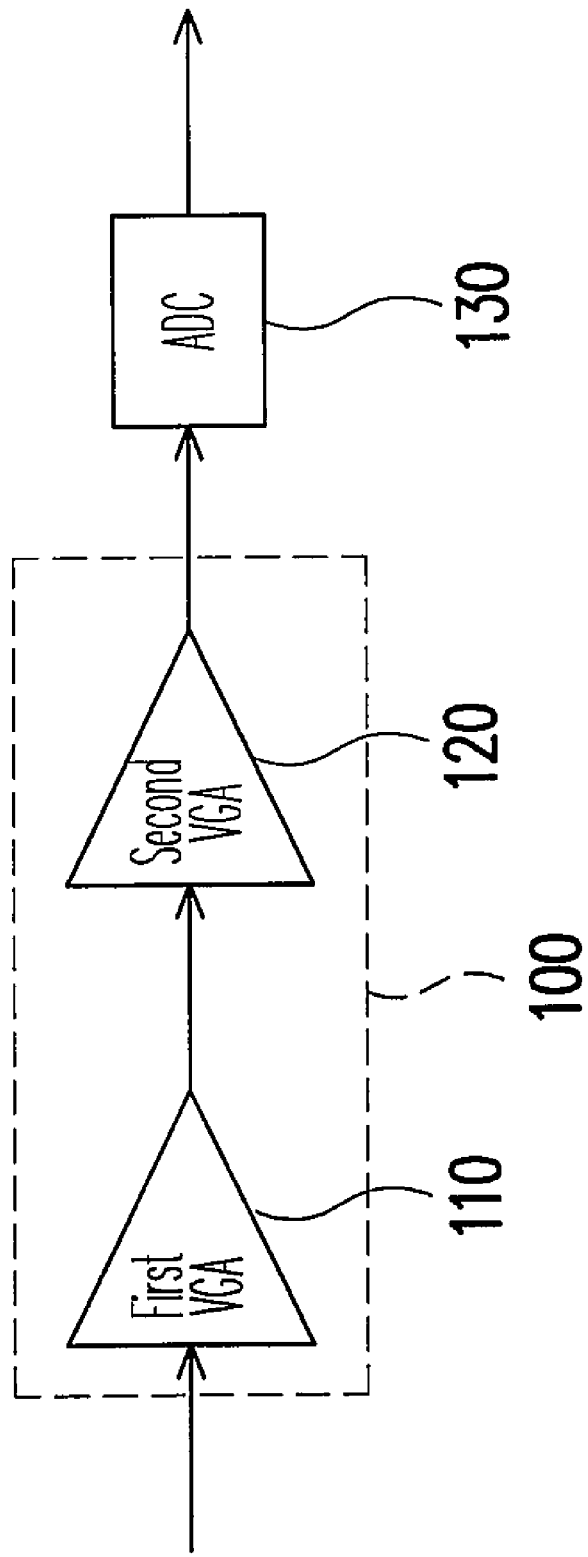
FIG. 1 is a variable-gain amplifier circuit for receiving and amplifying an image sensing signal in the conventional CMOS image sensor.
Figure 2:
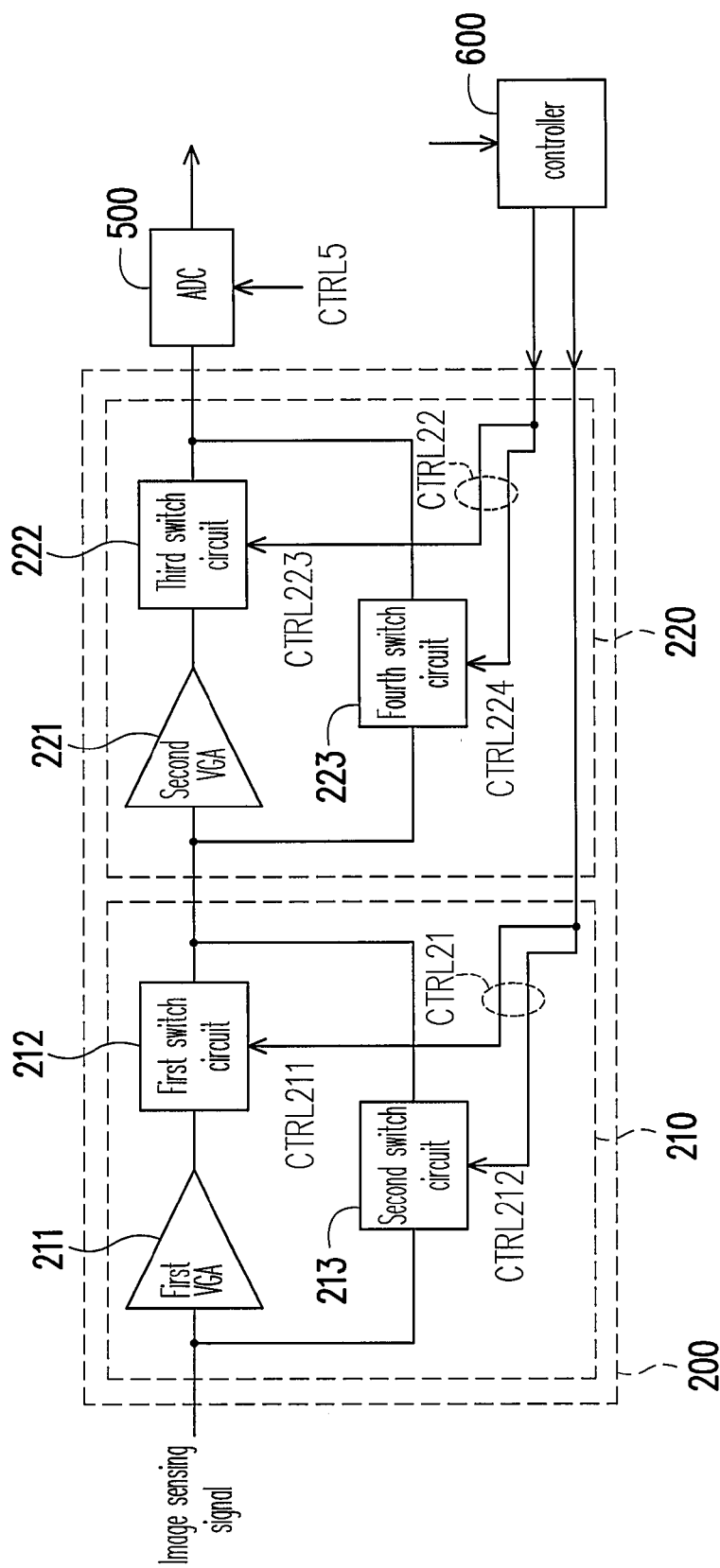
FIG. 2 is a variable-gain amplifier circuit for receiving and amplifying an image sensing signal according to a preferred embodiment of the present invention.

FIG. 2 is a schematic view of a variable-gain amplifier circuit 200 for receiving and amplifying an image sensing signal according a preferred embodiment of the present invention. As shown in FIG. 2, the variable-gain amplifier circuit 200 comprises a first variable path and gain amplifier circuit 210 and a second variable path and gain amplifier circuit 220. The first variable path and gain amplifier circuit 210 comprises a first VGA 211, a first switch circuit 212, and a second switch circuit 213. The first switch circuit 212 is connected in series with the first VGA 211. The second switch circuit 213 is coupled between the input end and the output end of the first variable path and gain amplifier circuit. The first variable path and gain amplifier circuit 210 makes the signal at the output end to be the signal at the input end being amplified by the first VGA 211 or bypassing without being amplified by the first VGA 211 according to a first control signal CTRL 21. The first control signal CTRL 21 turns on either the first switch circuit 212 or the second switch circuit 213 at a time. That is, a control signal CTRL211 in the first control signal CTRL 21 turns on the first switch circuit 212 and meanwhile a control signal CTRL212 in the first control signal CTRL 21 turns off the second switch circuit 213. Otherwise, a control signal CTRL211 in the first control signal CTRL 21 turns off the first switch circuit 212 and meanwhile a control signal CTRL212 in the first control signal CTRL 21 turns on the second switch circuit 213. Therefore, under the control of the first control signal CTRL 21, the input sensing signal can be amplified by the first VGA 211 or directly bypass the first variable path and gain amplifier circuit 210 via the second switch circuit 213 without being amplified.

According to the existing characteristics of the switch circuit and series circuit, in the first variable path and gain amplifier circuit 210, the positions of the first switch circuit 212 and the first VGA 211 can be exchanged without affecting the characteristics and functions of the first variable path and gain amplifier circuit 210. In other words, the first switch circuit 212 can be coupled between the output end of the first VGA 211 and the output end of the first variable path and gain amplifier circuit 210, or the first switch circuit 212 can be coupled between the input end of the first variable path and gain amplifier circuit 210 and the input end of the first VGA 211, for achieving the same circuit characteristics and functions.

The second variable path and gain amplifier circuit 220 comprises a second VGA 221, a third switch circuit 222, and a fourth switch circuit 223. The third switch circuit 222 is connected in series with the second VGA 221. The fourth switch circuit 223 is coupled between the input end and output end of the second variable path and gain amplifier circuit. The second variable path and gain amplifier circuit 220 makes the signal at the output end to be the signal at the input end being amplified by the second VGA 221 or bypassing without being amplified by the second VGA 221 according to a second control signal CTRL 22. The second control signal CTRL 22 turns on either the third switch circuit 222 or the fourth switch circuit 223 at a time. That is, a control signal CTRL223 in the second control signal CTRL 22 turns on the third switch circuit 222 and meanwhile a control signal CTRL224 in the second control signal CTRL 22 turns off the fourth switch circuit 223. Otherwise, a control signal CTRL223 in the second control signal CTRL 22 turns off the third switch circuit 222 and meanwhile a control signal CTRL224 in the second control signal CTRL 22 turns on the fourth switch circuit 223. Therefore, under the control of the second control signal CTRL 22, the output signal of the first variable path and gain amplifier circuit 210 can be amplified by the second VGA 221 or directly bypass the second variable path and gain amplifier circuit 220 via the fourth switch circuit 223 without being amplified.

According to the existing characteristics of the switch circuit and series circuit, in the second variable path and gain amplifier circuit 220, the positions of the third switch circuit 222 and the second VGA 221 can be exchanged without affecting the characteristics and functions of the second variable path and gain amplifier circuit 220. In other words, the third switch circuit 222 can be coupled between the output end of the second VGA 221 and the output end of the second variable path and gain amplifier circuit 220, or the third switch circuit 222 can be coupled between the input end of the second variable path and gain amplifier circuit 220 and the input end of the second VGA 221, for achieving the same circuit characteristics and functions.

As shown in FIG. 2, the output end of the variable-gain amplifier circuit 200 is coupled to an ADC 500. As shown in the figure, there are four paths for the image sensing signal passing from the input end of the first variable path and gain amplifier circuit 210 to the ADC 500, namely, passing from the first VGA 211, the first switch circuit 212, the second VGA 221, and the third switch circuit 222 to the ADC 500; passing from the second switch circuit 213, the second VGA 221, and the third switch circuit 222 to the ADC 500; passing from the first VGA 211, the first switch circuit 212, and the fourth switch circuit 223 to the ADC 500; passing from the second switch circuit 213 and the fourth switch circuit 223 to the ADC 500. When the signal at the output end of the variable-gain amplifier circuit 200 is the image sensing signal being amplified by the first VGA 211 and the second VGA 221 (i.e., being amplified by passing through the above first path), the ADC 500 reduces the resolution of the output digital signal.

The input end of the controller 600 is coupled to the output end of the ADC 500. Thus, the controller 600 outputs the first control signal CTRL 21 and the second control signal CTRL 22 according to the digital signal output by the ADC 500, so as to control the paths inside the first variable path and gain amplifier circuit 210 and the second variable path and gain amplifier circuit 220.

In order to obtain the first control signal CTRL 21 and the second control signal CTRL 22, the digital signal output by the ADC 500 is directly input into the controller 600, or the digital signal output by the ADC 500 is processed to generate signal to be input into the controller 600. For example, the ADC 500 is coupled to an image processor. The output signal of the ADC 500 is processed by the image processor to obtain an image result. Then, the controller 600 can generate the first control signal CTRL 21 and the second control signal CTRL 22 according to the image result.

If the image is bright, this indicates that the image sensing signal has a high strength, resolution and signal-to-noise ratio, and a low amplification factor is required, and thus the signal passes through a less number of VGA. When the signal is amplified by every VGA, the gain error is incurred. Therefore, if the signal only passes through a few VGAs, the incurred gain error is small, thus achieving a better performance. At this time, the image sensing signal can optionally skip the first VGA 211 or the second VGA 221. For example, the amplification factor of the first VGA 211 is 1~4 and the gain step is 0.5, and the amplification factor of the second VGA 221 is 1~4 and the gain step is 0.05. If the image sensing signal is required to be amplified by a factor of 1~4, the first control signal CTRL 21 correspondingly generated by the controller 600 turns off the first switch circuit 212 and turns on the second switch circuit 213. Meanwhile, the second control signal CTRL 22 correspondingly generated by the controller 600 turns on the third switch circuit 222 and turns off the fourth switch circuit 223. As such, the image sensing signal bypasses without passing through the first VGA 211 and is directly amplified by the second VGA 221, thereby achieving a better performance and meanwhile reducing the power consumption of the whole circuit. In general, if the DC gain of the operational amplifier in the first VGA 211 is A1, and the DC gain of the operational amplifier in the second VGA 221 is A2, the gains of the first VGA 211 and the second VGA 221 are both 1. As such, the gain error of the variable-gain amplifier circuit 200 can be reduced to approximately 1/A1 or 1/A2, thus reducing the design requirement of the circuit. Therefore, the DC gain of the operational amplifier in the first VGA 211 or the second VGA 221 can be reduced by approximately 6 db.

If the image is dim, this indicates that the image sensing signal has a low strength, resolution, and signal-to-noise ratio, and a large amplification factor is required, and thus the signal must be amplified by more numbers of VGAs. At this time, the image sensing signal passes through the first VGA 211 and the second VGA 221. For example, at this time, the first control signal CTRL 21 correspondingly generated by the controller 600 turns on the first switch circuit 212 and turns off the second switch circuit 213. Meanwhile, the second control signal CTRL 22 correspondingly generated by the controller 600 turns on the third switch circuit 222 and turns off the fourth switch circuit 223. As such, the image sensing signal is amplified by the first VGA 211 and the second VGA 221. If the gain of the first VGA 211 is $1/\beta_1$, and the gain of the second VGA 221 is $1/\beta_2$, the gain error of the variable-gain amplifier circuit 200 is $1/(A1\cdot\beta_1)+1/(A2\cdot\beta_2)$. Although the gain error rises, the signal-to-noise ratio of the image sensing signal currently is relatively low, and thus, the value of the gain error is far smaller than the signal-to-noise ratio of the image sensing signal, thereby avoiding affecting the output of the image result.

The present invention can present better characteristics when taking the processing time into consideration. In FIG. 2, if the ADC 500 is a pipelined ADC, the internal resolution order of the ADC 500 is adjusted to make the whole circuit attain the same processing time when the input image sensing signal has different strengths. For example, if the strength of the input image sensing signal is high, the signal-to-noise ratio of the image sensing signal is high. As described above, in this circumstance, the image sensing signal skips the first VGA 211 or the second VGA 221. At this time, an ADC of high resolution is required and a control signal CTRL 5 is used to set the internal resolution order of the ADC 500 to be a higher value. When the strength is low, the signal-to-noise ratio of the image sensing signal is relatively low. As described above, in this circumstance, the image sensing signal passes through the first VGA 211 and the second VGA 221. At this time, only an ADC of low resolution is required, and the control signal CTRL 5 is used to set the internal resolution order of the ADC 500 to be a lower value. As the internal resolution order of the ADC becomes lower, the resolution thereof is reduced. However, the distortion of the signal at this time is great, thus avoiding affecting the image result. In the second situation, although the processing time is relatively increased due to the image sensing signal passing through the first VGA 211 and the second VGA 221, the required image result can be obtained by a few clock signals due the low internal resolution order of the ADC 500. Therefore, the whole circuit can obtain the same processing time as the first situation, which is another remarkable advantage of the present invention.

The variable-gain amplifier circuit 200 optionally comprises a plurality of variable path and gain amplifier circuits, wherein each of the variable path and gain amplifier circuits comprises a VGA, a first switch circuit, and a second switch circuit. The first switch circuit is connected in series with the VGA. The second switch circuit is coupled between the input end and output end of each of the variable path and gain amplifier circuits. Each variable path and gain amplifier circuit makes the signal at the output end to be the signal at the input end either being amplified by the VGA or bypassing without being amplified by the VGA according to a control signal. The control signal turns on either the first switch circuit or the second switch circuit at a time. That is, the control signal turns on the first switch circuit and meanwhile turns off the second switch circuit. Otherwise, the control signal turns off the first switch circuit and meanwhile turns on the second switch circuit. Therefore, under the control of the control signal, the signal can be amplified by the VGA or bypass the variable path and gain amplifier circuit via the second switch circuit without being amplified.

According to the existing characteristics of the switch circuit and series circuit, in each of the variable path and gain amplifier circuits, the positions of the first switch circuit and the VGA can be exchanged without affecting the characteristics and functions of the variable path and gain amplifier circuit. In other words, the first switch circuit can be coupled between the output end of the VGA and the output end of the variable path and gain amplifier circuit, or the first switch circuit can be coupled between the input end of the first variable path and gain amplifier circuit and the input end of the VGA, for achieving the same circuit characteristics and functions.

When the variable-gain amplifier circuit 200 comprises a plurality of variable path and gain amplifier circuits, the output end of the variable-gain amplifier circuit is coupled to the ADC. When the signal at the output end of the variable-gain amplifier circuit is the image sensing signal being amplified by a plurality of VGAs, the ADC reduces the resolution of the output digital signal. The input end of the controller is coupled to the output end of the ADC, such that the controller can output the control signals according to the digital signal output by the ADC, so as to control the paths in the variable path and gain amplifier circuits.

Figure 3:
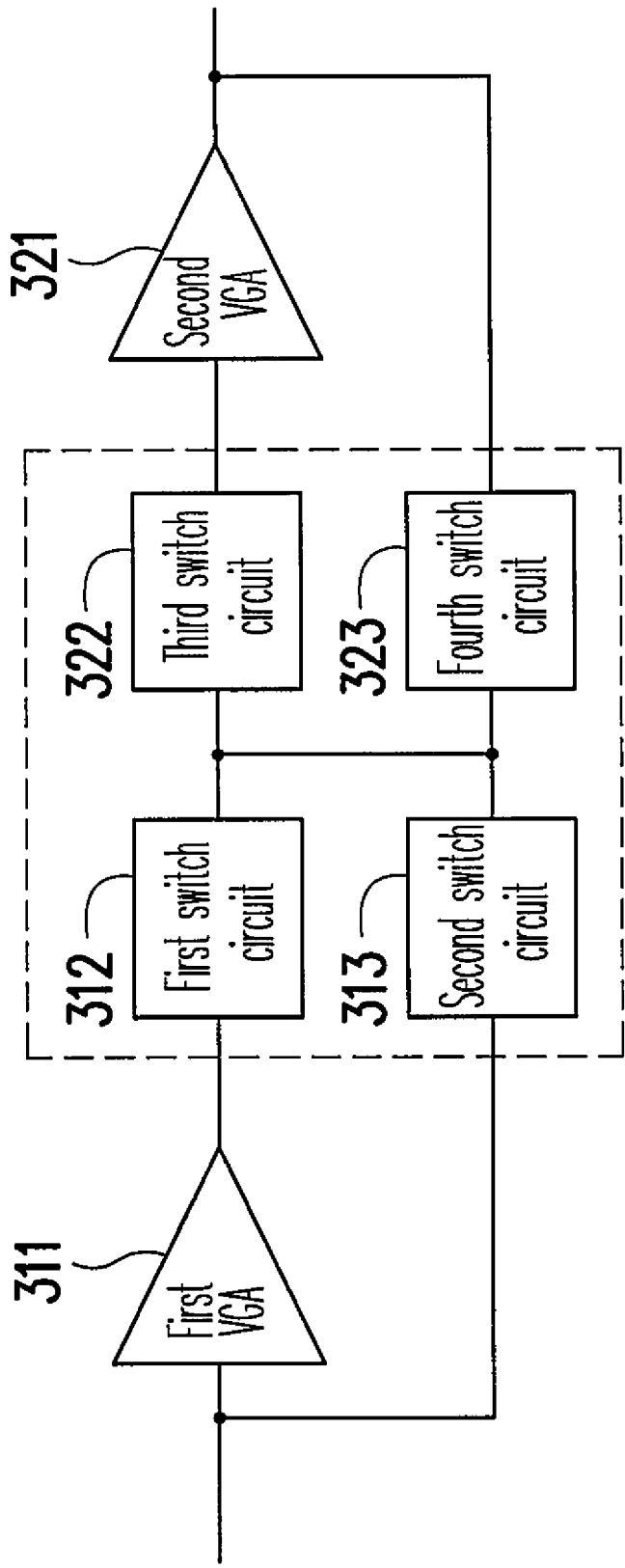
FIG. 3 is a variable-gain amplifier circuit for receiving and amplifying an image sensing signal according to another preferred embodiment of the present invention.

FIG. 3 is a schematic view of a variable-gain amplifier circuit 300 for receiving and amplifying an image sensing signal according to another preferred embodiment of the present invention. As shown in FIG. 3, the variable-gain amplifier circuit 300 comprises a first VGA 311, a second VGA 321, a first switch circuit 312, a second switch circuit 313, a third switch circuit 322, and a fourth switch circuit 323. It can be seen from comparing the variable-gain amplifier circuit 300 in FIG. 3 and the variable-gain amplifier circuit 200 in FIG. 2 that, according to the existing characteristics of the switch circuit and series circuit, in the variable-gain amplifier circuit 200, the positions of the third switch circuit 222 and the second VGA 221 can be exchanged to obtain the variable-gain amplifier circuit 300 in FIG. 3. As such, the variable-gain amplifier circuit 300 has the same characteristics and circuit functions as the variable-gain amplifier circuit 200 of FIG. 2, thus achieving the same objective as the embodiment of FIG. 2, and the details will not be described herein.

It can be known from the above two embodiments that though the VGAs and some switch circuits in the figures are connected in series and separated as two components, the present invention is not limited to this. In practice, some VGAs can control whether or not enabling the output, so the switch circuits connected in series can be omitted or the switch circuits can be integrated into the VGAs to form a single component, which also falls in the scope of the present invention.

Seen from the above, the present invention provides a method of changing the gain amplifier paths for receiving and amplifying an image sensing signal. The method comprises providing the first VGA and the second VGA; making an intermediate signal to be the image sensing signal either being amplified by the first VGA or bypassing without being amplified by the first VGA according to the first control signal; and making the output signal to be the above intermediate signal either being amplified by the second VGA or bypassing without being amplified by the second VGA according to the second control signal.

Figure 4:
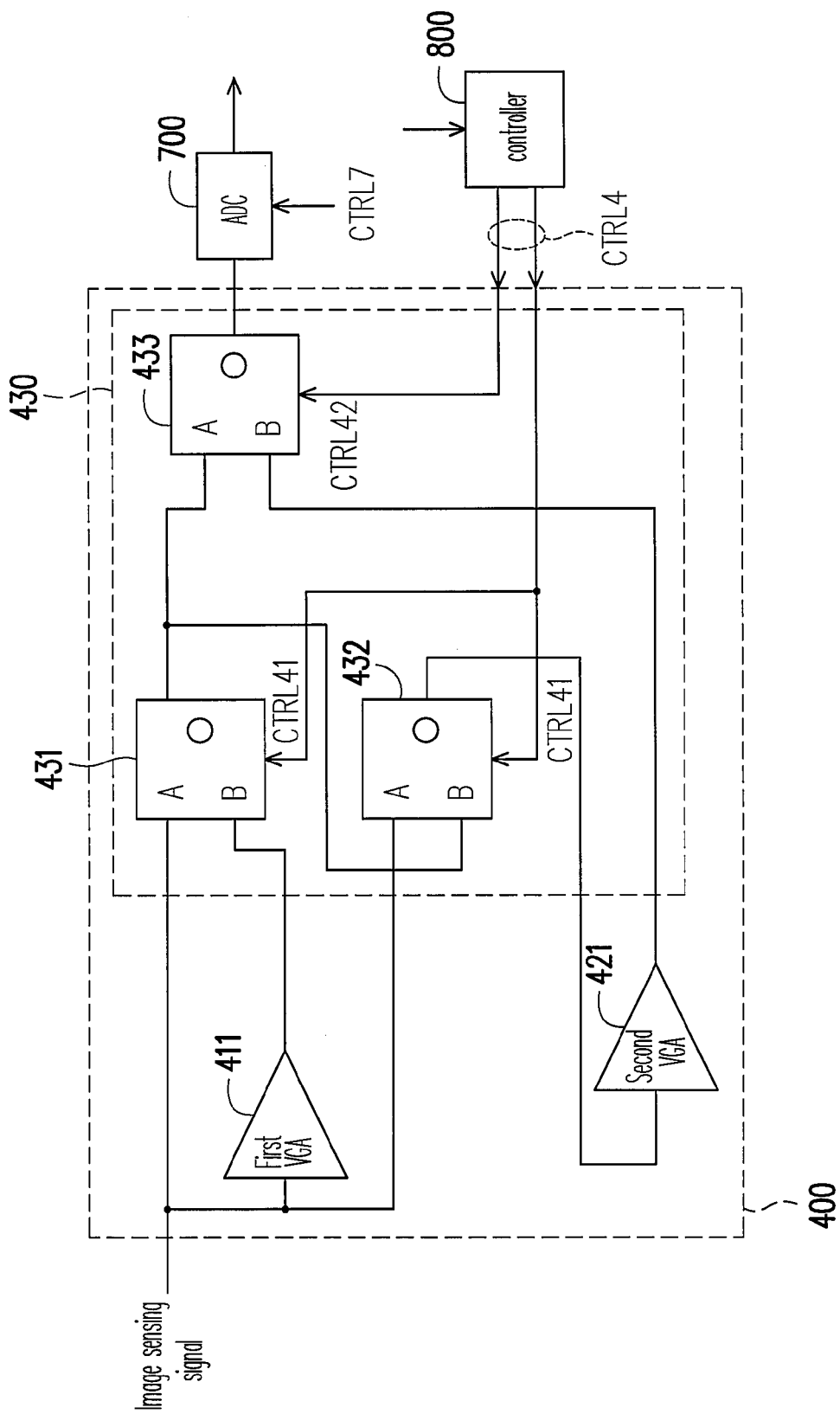
FIG. 4 is a variable-gain amplifier circuit for receiving and amplifying an image sensing signal according to another preferred embodiment of the present invention.

FIG. 4 is a schematic view of a variable-gain amplifier circuit 400 for receiving and amplifying an image sensing signal according to another preferred embodiment of the present invention. As shown in FIG. 4, the variable-gain amplifier circuit 400 comprises a first VGA 411, a second VGA 421, and a path changing circuit 430, wherein the path changing circuit 430 is coupled to the first VGA 411 and the second VGA 421. As shown in the figure, the path changing circuit 430 comprises a first mutiplexer 431, a second mutiplexer 432, and a third mutiplexer 433. The path changing circuit 430 makes the signal at the output end of the variable-gain amplifier circuit to be the image sensing signal being amplified by either the first VGA 411 or the second VGA 421, or bypassing without being amplified by both the amplifiers, or being amplified by both the first VGA 411 and the second VGA 421 according to a control signal CTRL 4.

As shown in FIG. 4, the output end of the variable-gain amplifier circuit 400 is coupled to an ADC 700. When the signal at the output end of the variable-gain amplifier circuit 400 is the image sensing signal being amplified by the first VGA 411 and the second VGA 421, the ADC 700 reduces the resolution of the output digital signal. The input end of a controller 800 is coupled to the output end of the ADC 700. At this time, the controller 800 outputs the control signal CTRL 4 according to the digital signal output by the ADC 800, so as to control the path changing circuit 430. For example, the control signals CTRL 41 and CTRL 42 in the control signal CTRL 4 control the mutiplexers 431, 432, and 433 in the path changing circuit 430 to make the image sensing signal at the input end of the variable-gain amplifier circuit 400 pass through various paths to the ADC 700. Referring to FIG. 4, it is apparent to those skilled in the art that the principle and functions of the variable-gain amplifier circuit of FIG. 4 are the same as the variable-gain amplifier circuit 200 of FIG. 2 and the variable-gain amplifier circuit 300 of FIG. 3, and the details will not be described herein again.

Seen from the above, the present invention also provides another method of changing the gain amplifier paths for receiving and amplifying an image sensing signal. The method comprises providing a first VGA and a second VGA, and making the output signal to be the image sensing signal at the input end being amplified by passing through either the first VGA or the second VGA, or bypassing without being amplified by both the first and second VGAs, or being amplified by both of the two VGAs according to a control signal.

In view of the above, in the variable-gain amplifier circuit of the present invention, the method of dynamically changing the gain amplifier paths is adopted to obtain an appropriate construction of the variable-gain amplifier circuit, thereby reducing the design requirement of the circuit.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A variable-gain amplifier circuit, for receiving and amplifying an image sensing signal, comprising:
    a first variable path and gain amplifier circuit, having a first variable gain amplifier (VGA), for making the signal at the output end to be the signal at the input end either being amplified by the first VGA or bypassing without being amplified by the first VGA according to a first control signal;
    a second variable path and gain amplifier circuit, having a second VGA, for making the signal at the output end to be the signal at the input end either being amplified by the second VGA or bypassing without being amplified by the second VGA according to a second control signal; and
    a controller coupled to the first and the second variable path and gain amplifier circuits, generating the first control signal and the second control signal according to a digital signal of an analog-to-digital converter, so as to control paths in the first and second variable path and gain amplifier circuits,
    wherein the output end of the variable-gain amplifier circuit is coupled to the analog-to-digital converter, and when the signal at the output end of the variable-gain amplifier circuit is the image sensing signal being amplified by the first VGA and the second VGA, the analog-to-digital converter reduces the resolution of the output digital signal.

2. The variable-gain amplifier circuit according to claim 1, wherein the first variable path and gain amplifier circuit further comprises:
    a first switch circuit, connected in series with the first VGA; and
    a second switch circuit, coupled between the input end and the output end of the first variable path and gain amplifier circuit,
    wherein the first control signal turns on either the first switch circuit or the second switch circuit at a time.

3. The variable-gain amplifier circuit according to claim 2, wherein the first switch circuit is coupled between the output end of the first VGA and the output end of the first variable path and gain amplifier circuit.

4. The variable-gain amplifier circuit according to claim 2, wherein the first switch circuit is coupled between the input end of the first variable path and gain amplifier circuit and the input end of the first VGA.

5. The variable-gain amplifier circuit according to claim 1, wherein the second variable path and gain amplifier circuit further comprises:
- a third switch circuit, connected in series with the second VGA; and
- a fourth switch circuit, coupled between the input end and the output end of the second variable path and gain amplifier circuit,
- wherein the second control signal turns on either the third switch circuit or the fourth switch circuit at a time.

6. The variable-gain amplifier circuit according to claim 5, wherein the third switch circuit is coupled between the output end of the second VGA and the output end of the second variable path and gain amplifier circuit.

7. The variable-gain amplifier circuit according to claim 5, wherein the third switch circuit is coupled between the input end of the second variable path and gain amplifier circuit and the input end of the second VGA.

8. A variable-gain amplifier circuit, for receiving and amplifying an image sensing signal, comprising:
- a plurality of variable path and gain amplifier circuits connected in series, wherein each of the variable path and gain amplifier circuits comprises a VGA, and makes the signal at the output end to be the signal at the input end either being amplified by the VGA or bypassing without being amplified by the VGA according to a control signal; and
- a controller coupled to the variable path and gain amplifier circuits, generating the control signals according to a digital signal of an analog-to-digital converter, so as to control paths in the variable path and gain amplifier circuits,
- wherein the output end of the variable-gain amplifier circuit is coupled to the analog-to-digital converter, and when the signal at the output end of the variable-gain amplifier circuit is the image sensing signal being amplified by the first VGA and the second VGA, the analog-to-digital converter reduces the resolution of the output digital signal.

9. The variable-gain amplifier circuit according to claim 8, wherein each of the variable path and gain amplifier circuits further comprises:
- a first switch circuit, connected in series with the VGA; and
- a second switch circuit, coupled between the input end and output end of each of the variable path and gain amplifier circuits,
- wherein the control signal turns on either the first switch circuit or the second switch circuit at a time.

10. The variable-gain amplifier circuit according to claim 9, wherein the first switch circuit is coupled between the output end of the VGA and the output end of each of the variable path and gain amplifier circuits.

11. The variable-gain amplifier circuit according to claim 9, wherein the first switch circuit is coupled between the input end of each of the variable path and gain amplifier circuits and the input end of the VGA.

12. A variable-gain amplifier circuit, for receiving and amplifying an image sensing signal, comprising:
- a first VGA;
- a second VGA; and
- a path changing circuit, coupled to the first VGA and the second VGA, wherein the path changing circuit makes the signal at the output end of the variable-gain amplifier circuit to be the image sensing signal being amplified by the first VGA or the second VGA, or bypassing without being amplified by both the first and the second VGAs, or being amplified by both the two VGAs according to a control signal; and
- a controller coupled to the path changing circuit, generating the control signal according to a digital signal output of an analog-to-digital, so as to control the path changing circuit,
- wherein the output end of the variable-gain amplifier circuit is coupled to the analog-to-digital converter, and when the signal at the output end of the variable-gain amplifier circuit is the image sensing signal being amplified by the first VGA and the second VGA, the analog-to-digital converter reduces the resolution of the output digital signal.

13. A method of changing the gain amplifier paths, for receiving and amplifying an image sensing signal, comprising:
- providing a first VGA and a second VGA;
- making an intermediate signal to be the image sensing signal either being amplified by the first VGA or bypassing without being amplified by the first VGA according to a first control signal;
- making an output signal to be the intermediate signal either being amplified by the second VGA or bypassing without being amplified by the second VGA according to a second control signal,
- wherein the first control signal and the second control signal are generated according to a digital signal output of an analog-to-digital converter coupled to the output end of the variable-gain amplifier circuit, so as to control the gain amplifier paths, and when the signal at the output end of the variable-gain amplifier circuit is the image sensing signal being amplified by the first VGA and the second VGA. the analog-to-digital converter reduces the resolution of the output digital signal.

14. A method of changing the gain amplifier paths, for receiving and amplifying an image sensing signal, comprising:
- providing a first VGA and a second VGA; and
- making an output signal to be the image sensing signal at the input end being amplified by the first VGA or the second VGA, or bypassing without being amplified both the first and second VGAs, or being amplified by both the VGAs according to a control signal,
- wherein the control signal is generated according to a digital signal of an analog-to-digital converter coupled to the output end of the variable-gain amplifier circuit, so as to control the gain amplifier paths, and when the signal at the output end of the variable-gain amplifier circuit is the image sensing signal being amplified by the first VGA and the second VGA, the analog-to-digital converter reduces the resolution of the output digital signal.

* * * * *